(12) United States Patent
Chen et al.

(10) Patent No.: US 7,449,716 B2
(45) Date of Patent: Nov. 11, 2008

(54) BOND QUALITY INDICATION BY BUMP STRUCTURE ON SUBSTRATE

(75) Inventors: Ming-Yao Chen, Taipei (TW);
Sheng-Shu Yang, Hsinchu (TW);
Shyh-Ming Chang, Hsinchu (TW);
Ngai Tsang, Tainan (TW)

(73) Assignees: Taiwan TFT LCD Association, Hsinchu (TW); Chunghwa Picture Tubes, LTD., Taoyuan (TW); Au Optronics Corporation, Hsinchu (TW); Hannstar Display Corporation, Taipei (TW); Chi Mei Optoelectronics Corporation, Tainan County (TW); Industrial Technology Research Institute, Hsinchu (TW); TPO Displays Corp., Miao-Li County (TW)

( * ) Notice: Subject to any disclaimer, the term of this patent is extended or adjusted under 35 U.S.C. 154(b) by 0 days.

(21) Appl. No.: 11/758,013

(22) Filed: Jun. 5, 2007

(65) Prior Publication Data

US 2008/0197352 A1 Aug. 21, 2008

(30) Foreign Application Priority Data

Feb. 16, 2007 (TW) .............................. 96106105 A

(51) Int. Cl.
*H01L 23/58* (2006.01)
*H01L 23/544* (2006.01)
(52) U.S. Cl. .................... 257/48; 257/778; 257/797; 257/E23.179
(58) Field of Classification Search ................ 257/737, 257/48, 778, 797, E23.179
See application file for complete search history.

(56) References Cited

U.S. PATENT DOCUMENTS

| 5,707,902 | A | | 1/1998 | Chang et al. |
| 5,828,128 | A | * | 10/1998 | Higashiguchi et al. ...... 257/738 |
| 6,972,490 | B2 | | 12/2005 | Chang et al. |
| 2005/0224991 | A1 | * | 10/2005 | Yeo .............................. 257/781 |
| 2008/0012150 | A1 | * | 1/2008 | Yang ........................... 257/780 |

* cited by examiner

*Primary Examiner*—Evan Pert
(74) *Attorney, Agent, or Firm*—Jianq Chyun IP Office

(57) ABSTRACT

A bump structure on a substrate including at least one first electrode, at least one first bump, at least one second bump is provided. The first electrode is disposed on the substrate. The first bump is disposed on the first electrode. The second bump is disposed on the substrate. The height of the second bump is greater than that of the first bump. The elastic bump of the present invention can be used for measuring the bonding process quality.

21 Claims, 13 Drawing Sheets

BOND QUALITY INDICATION BY BUMP STRUCTURE ON SUBSTRATE

CROSS-REFERENCE TO RELATED APPLICATION

This application claims the priority benefit of Taiwan application serial no. 96106105, filed Feb. 16, 2007. All disclosure of the Taiwan application is incorporated herein by reference.

BACKGROUND OF THE INVENTION

1. Field of the Invention

The present invention generally relates to a bump structure on a substrate, in particular, to a bump structure for measuring bonding process quality.

2. Description of Related Art

In general, size of the gap between a glass substrate and a chip in a chip-on-glass (COG) process is determined by several factors including processing pressure, properties of plastic, stress relieve and so on. To determine the foregoing processing parameters, the selection of the gap between the chip and the glass substrate is particularly important. At present, the size of the gap between the glass substrate and the chip can be determined by performing a slice-up analysis using a scanning electron microscope (SEM) after the bonding process. However, this method of analysis wastes a lot of time.

Furthermore, when the anisotropic conductive film (ACF) is used in the chip-on-glass bonding process, the method of measuring the bonding quality is to inspect the bonding conditions of the conductive particles in ACF to determine if the bonding is good. When the bonding is inadequate, the conductive particles are mostly unbroken and electrically non-conductive. On the contrary, if the bonding force is too large, the conductive particles may be over-compressed. The over-compression may lead to a non-conductive condition.

In addition, U.S. Pat. No. 5,707,902 has disclosed a design having sharp-pointed structures disposed on the bumps. After the bonding process, the pressure marks created by the sharp points on the bumps are utilized to determine the quality of the bonding process. However, this method cannot measure the size of the gap between the chip and the glass substrate effectively and instantaneously.

The method disclosed in U.S. Pat. No. 6,972,490 is adding stopper on the substrate so as to prevent bonding process failure due to over-bonding between the chip and the glass substrate. However, this method cannot measure the size of the gap between the glass substrate and the chip.

SUMMARY OF THE INVENTION

Accordingly, the present invention is directed to a bump structure on a substrate. The bump structure can be used to measure size of the gap between a glass substrate and a chip so as to determine the quality of a bonding process.

The present invention is directed to a bump structure on a substrate. The bump structure can be utilized to instantly determine size of the gap between a glass substrate and a chip and bonding process quality.

According to an embodiment of the present invention, a bump structure on a substrate is provided. The bump structure includes at least one first electrode, at least one first bump and at least one second bump. The first electrode is disposed on the substrate. The first bump is disposed on the first electrode. The second bump is disposed on the substrate, wherein the height of the second bump is greater than the height of the first bump.

The present invention also provides a bump structure on a substrate. The bump structure includes at least one first electrode, at least one first bump and a plurality of second bumps. The first electrode is disposed on the substrate. The first bump is disposed on the first electrode. The second bumps are disposed on the substrate, wherein the second bumps have more than two kinds of heights.

The present invention also provides a bump structure on a substrate. The bump structure includes at least one electrode and at least one staircase-shape bump. The electrode is disposed on the substrate. The staircase-shape bump is disposed on the substrate as well.

In the present invention, at least two kinds of bumps are disposed on the substrate. Moreover, the heights of at least the two kinds of bumps are different. Therefore, when the bonding process is subsequently performed, the degrees of deformations of the bumps with different heights can be directly observed to determine the quality of the bonding process. In another embodiment of the present invention, a staircase-shape bump is disposed on the substrate. Similarly, the degree of deformation of the staircase-shape bump can be directly observed to determine the quality of the bonding process.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
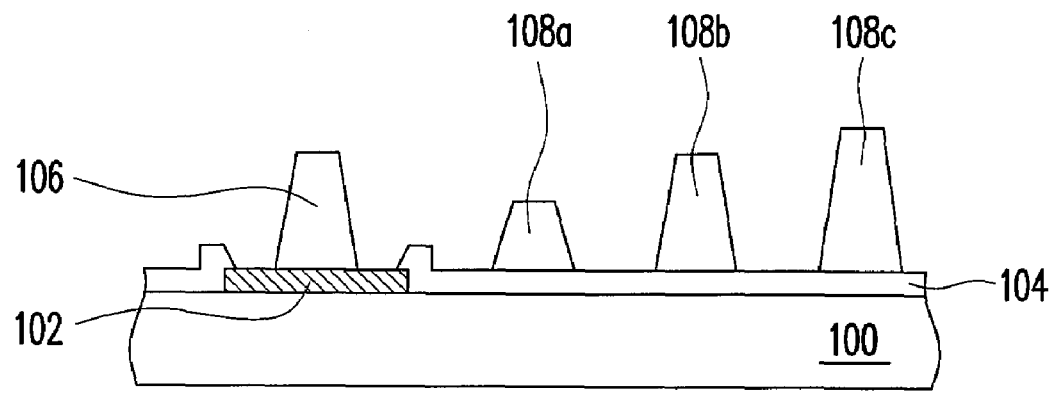
FIGS. 1A to 1C are schematic cross-sectional views showing a bump structure on a substrate and a corresponding bonding process according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

First Embodiment

Figure 1B:
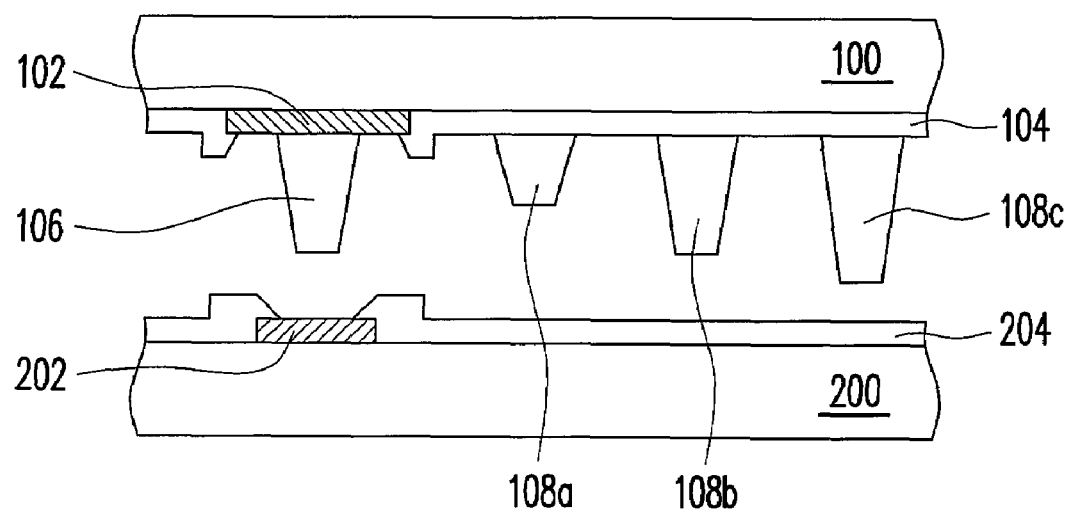
Figure 1C:
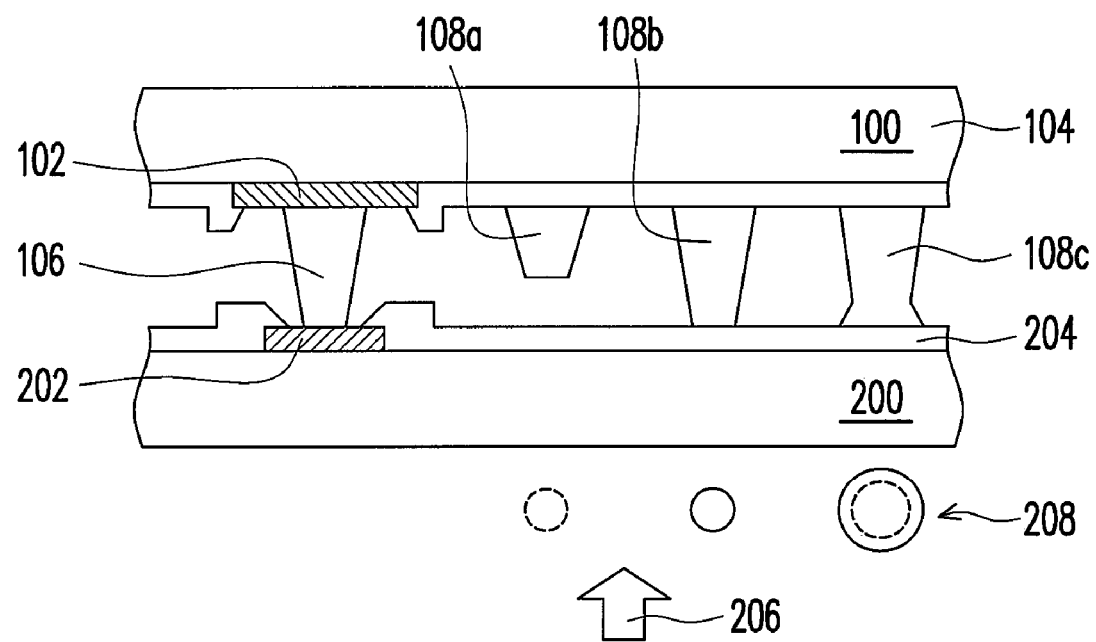

FIGS. 1A to 1C are schematic cross-sectional views showing a bump structure on a substrate and a corresponding bonding process according to an embodiment of the present invention. As shown in FIG. 1A, the bump structure in the present embodiment is disposed on a substrate 100. The bump structure includes at least one electrode 102, a first bump 106 and a plurality of second bumps 108a, 108b and 108c. In one preferred embodiment, the electrode 102 is formed on the substrate 100. Furthermore, the surface of the substrate 100 further includes a passivation layer 104 that exposes the electrode 102. The substrate 100 is a silicon substrate, a glass substrate, a printed circuit board, a flexible substrate or a ceramic substrate, for example. The material of the electrode 102 is a metal, for example. The first bump 106 is located on the electrode 102. The second bumps 108a, 108b and 108c are located on the substrate 100. In other words, the second bumps 108a, 108b and 108c are located outside the area where the electrode is disposed. Therefore, the second bumps 108a, 108b and 108c may form in any area on the substrate 100, for example, any area on the substrate 100 in which no circuits or devices are formed. The first bump 106 and the second bumps 108a, 108b, 108c can be metal bumps, conductive bumps, polymer bumps or elastic bumps each comprising a conductive layer cover a polymer bump. In addition, the horizontal cross-sections of the first bump 106 and the second bumps 108a, 108b, 108c are circles, ellipses, rectangles, polygons or a combination thereof.

More specifically, the second bumps 108a, 108b, 108c have different heights. For example, the height of the second bump 108a is lower than the height of the first bump 106 on the electrode 102 while the second bump 108b is at the same height as the first bump 106 on the electrode 102. The height of the second bump 108c is greater than the height of the first bump 106 on the electrode 102. The second bumps 108a, 108b and 108c on the substrate 100 are designed to have different heights so that the quality of a bonding process can be measured after the bonding process, the details of which are described below.

As shown in FIG. 1B, the substrate 100 having the first bump 106 and the second bumps 108a, 108b, 108c formed thereon is positioned to face another substrate 200. The substrate 200 has a contact 202 already formed thereon. In one preferred embodiment, the contact 202 is formed on the substrate 200, and the substrate 200 further includes a passivation layer 204 that exposes the contact 202. Similarly, the substrate 200 can be a silicon substrate, a glass substrate, a printed circuit board, a flexible substrate or a ceramic substrate, for example. For example, if the substrate 100 is a silicon substrate (a chip) and the substrate 200 is a glass substrate, then the bonding process described below is the so-called 'chip-on-glass' (COG) bonding process.

Next, as shown in FIG. 1C, a bonding process is performed so that the first bump 106 is made to contact the contact 202 on the substrate 200. At this time, because the second bumps 108a, 108b and 108c have different heights, different degrees of deformations are produced after the bonding process. More specifically, because the height of the second bump 108a is lower than the first bump 106, there is no contact between the second bump 108a and the substrate 200. On the other hand, because the height of the second bump 108b is the same as the height of the first bump 106, the second bump 108b just contacts the substrate 200. However, because the height of the second bump 108c is greater than the first bump 106, deformation of the second bump 108c is produced after the bonding process. Therefore, by looking from a direction indicated by the labelled arrow 206 and observing the pattern 208 produced by the second bumps 108a, 108b and 108b after the bonding process, whether the gap between the two substrates 100 and 200 meets the standard can be determined and the quality of the bonding process can be assessed. FIG. 1C shows the configuration resulting from a good bonding process. In other words, if there is no contact between the second bump 108b and the contact 202, it can be deduced that the bonding process is an inadequate process. On the other hand, if the second bump 108a also contacts the substrate 200, it can be deduced that the bonding process is an over-bonding process.

In the foregoing embodiment, three bumps with different heights disposed outside the electrode is used to determine the quality of the bonding process. However, there is no intention to limit the number of bumps to be used in the present invention. Two bumps, four bumps or more second bumps each having a different height can be used to determine the quality of the bonding process. Obviously, the present invention also permits using only a single bump to determine the quality of the bonding process, the details of which are described below.

Figure 2A:
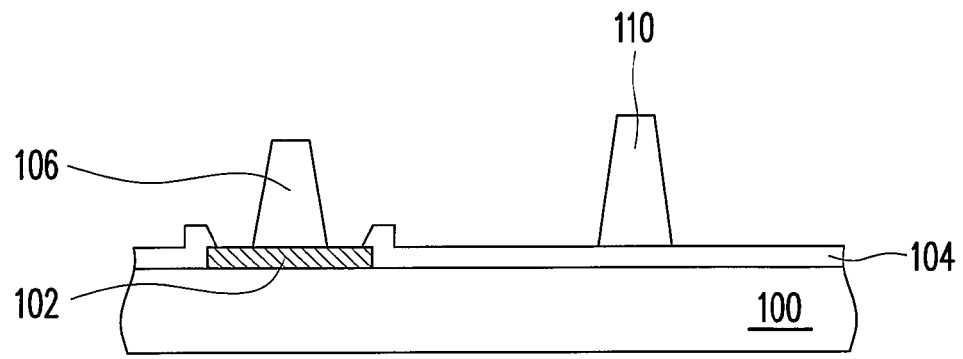
FIGS. 2A to 2C are schematic cross-sectional views showing a bump structure on a substrate and a corresponding bonding process according to another embodiment of the present invention.
Figure 2B:
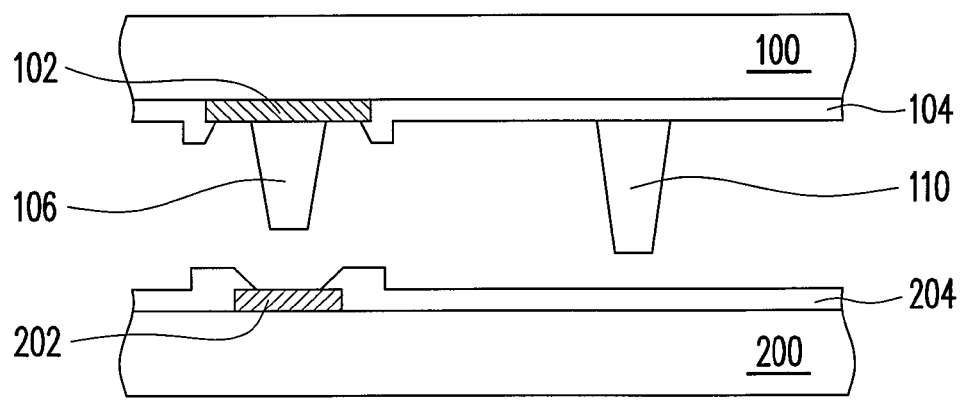
Figure 2C:
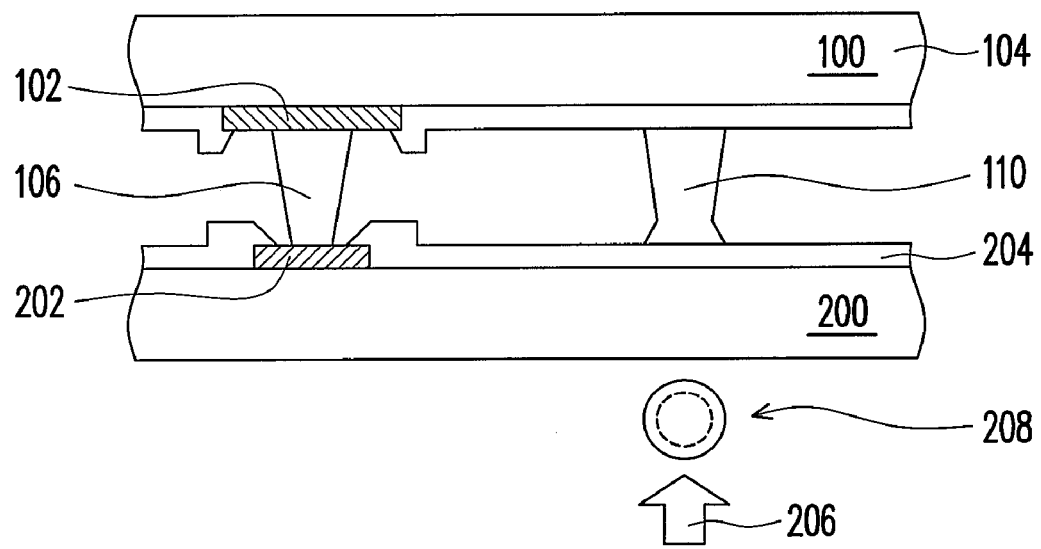

FIGS. 2A to 2C are schematic cross-sectional views showing a bump structure on a substrate and a corresponding bonding process according to another embodiment of the present invention. As shown in FIG. 2A, the bump structure on the substrate is similar to the one in FIG. 1A. The difference is that the second bump 110 is a single bump and the height of the second bump 110 is greater than the height of the first bump 106 on the electrode 102. Since the material of the second bump 110 and the shape of its horizontal cross-section are identical or similar to the second bumps 108a, 108b and 108c described in the FIG. 1A, a detailed description is omitted.

As shown in FIG. 2B, the foregoing substrate 100 with the first bumps 106 and the second bump 110 already formed thereon is similarly disposed to face another substrate 200. Next, as shown in FIG. 1C, a bonding process is performed so that the first bump 106 is made to contact the contact 202 on the substrate 200. At this time, because the height of the second bump 110 located outside the electrode 102 is greater than the height of the first bump 106, a deformation of the second bump 110 is produced after the bonding process. In other words, by looking from a direction indicated by the labelled arrow 206 and observing the pattern 208 produced by the second bump 110 after the bonding process, whether the gap between the two substrates 100 and 200 meets the standard can be determined and the quality of the bonding process can be assessed.

Figure 3:
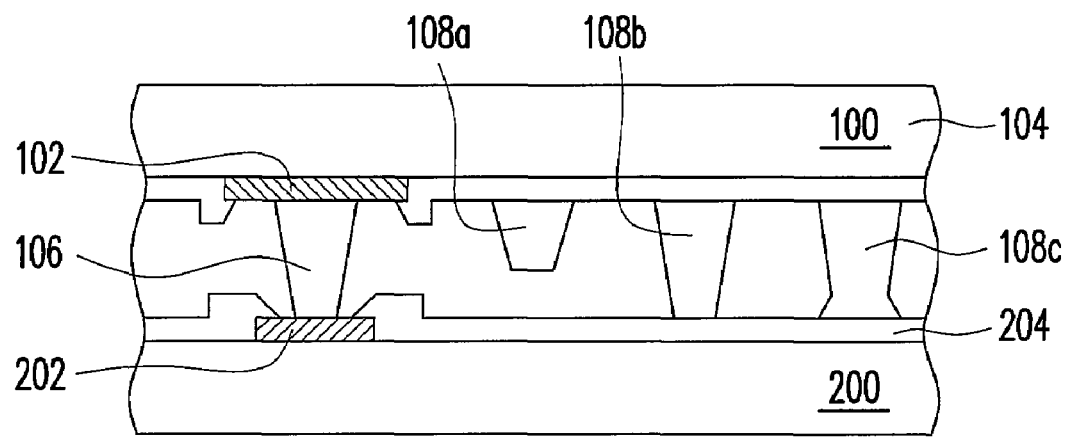
FIG. 3 is a schematic cross-sectional view showing a non-conductive layer disposed between two substrates according to an embodiment of the present invention.

The foregoing embodiment may further include forming a non-conductive film (NCF) 120 between the two substrates 100 and 200 as shown in FIG. 3. FIG. 3 uses the bumps having three different heights as shown in FIG. 1C as an example to illustrate the location of the NCF 120. In practice, a NCF layer (not shown) may also be disposed between the two substrates 100 and 200 in the embodiment shown in FIG. 2C.

Figure 4:
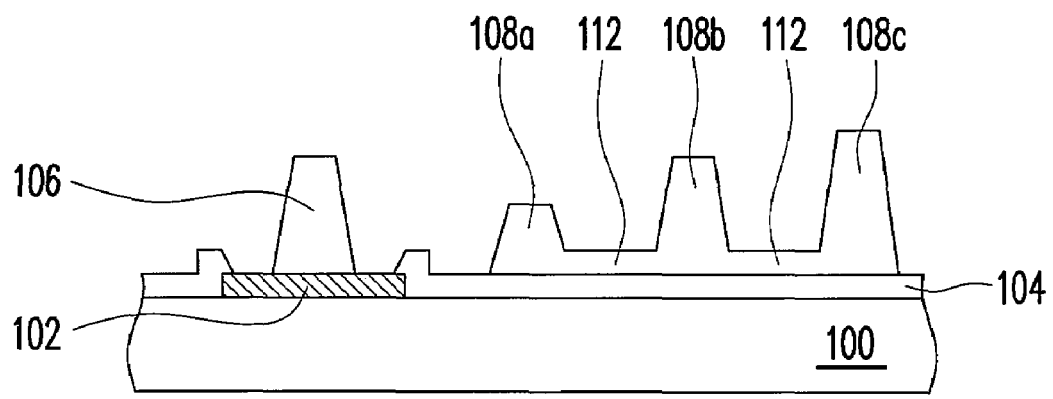
FIG. 4 is a schematic cross-sectional view of a connecting layer disposed between various second bumps according to an embodiment of the present invention.

In another embodiment of the present invention, if a plurality of second bumps (for example, the second bumps 108a, 108b, 108c) is disposed on the substrate 100, a connecting layer 112 may be disposed between every pair of the second bumps 108a, 108b and 108c as shown in FIG. 4. The material of the connecting layer 112 is, for example, identical to the material of the second bumps 108a, 108b and 108c. The connecting layer 112 is used mainly to prevent the second bumps 108a, 108b and 108c from slipping.

Figure 5:
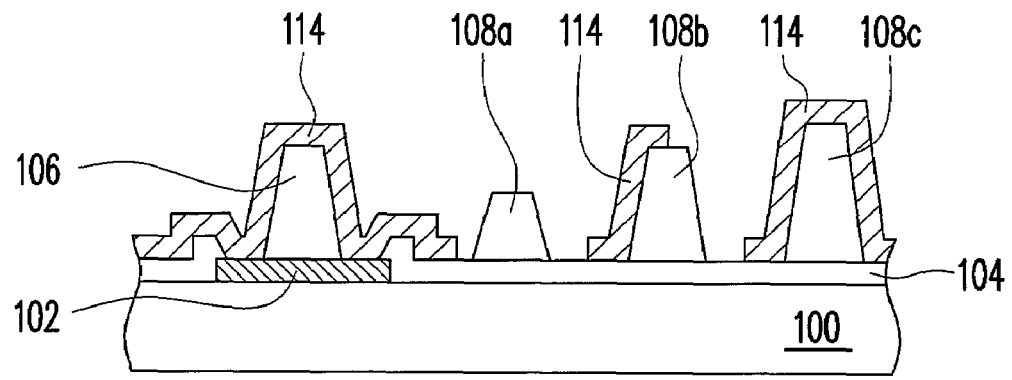
FIG. 5 is a schematic cross-sectional view showing a metal layer completely covering, partially covering and not covering second bumps according to an embodiment of the present invention.

In another embodiment of the present invention as shown in FIG. 5, the first bump and the second bumps can be elastic bumps. If the first bump and the second bumps are elastic bumps, then the first bump and the second bumps comprise polymer bumps 106, 108a, 108b, 108c and a metal layer 114 located on the polymer bumps 106, 108a, 108b, 108c, for example. The metal layer 114 may completely cover, partially cover or not cover the polymer bumps 108a, 108b and 108c of the second bumps. As shown in FIG. 5, the metal layer 114 does not cover the polymer bump 108a of the second bump, but the metal layer 114 covers part of the polymer bump 108b of the second bump and the whole polymer bump 108c of the second bump. However, the present invention is not intended to limit the scope as such. For example, all the polymer bumps 108a, 108b and 108c of the second bumps may be completely covered, partially covered or not covered by the metal layer 114.

Figure 6:
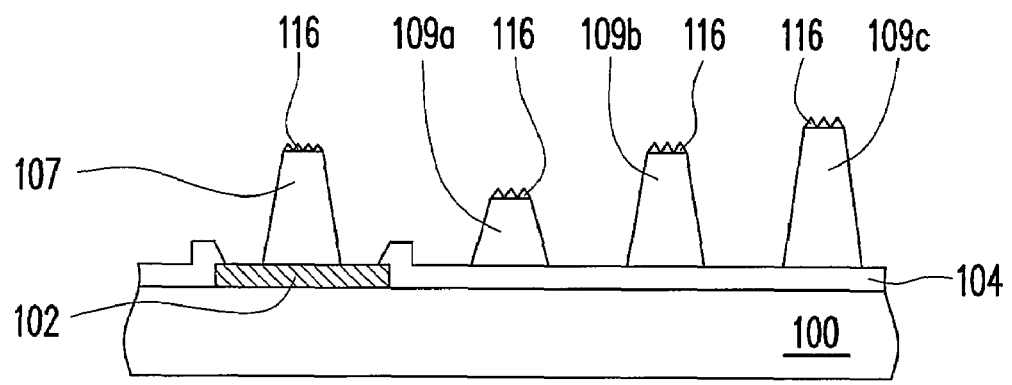
FIG. 6 and FIG. 7 are schematic cross-sectional views showing pointed structures on the top surfaces of the first and second bumps according to various embodiments of the present invention.

The top surfaces of the bump structures in the foregoing embodiments are flat surfaces. However, the present invention is not intended to limit the scope as such. In the present invention, the top surfaces of the bump structures may include a pointed structure. As shown in FIG. 6, the top surfaces of the bump structure 107 and the bump structures 109a, 109b and 109c have pointed structures 116. The pointed structures 116 are formed, for example, by exposing the bumps with different amount of light in the process of forming the bumps so that the bumps and the pointed structures are simultaneously defined. Therefore, the material of the bump structure 107 and the bump structures 109a, 109b and 109c having pointed structures 116 on their top surfaces must be high molecular material. Similarly, in the embodiment shown in FIG. 2A, the top surface of the bump structure 110 may include a pointed structure (not shown).

Figure 7:
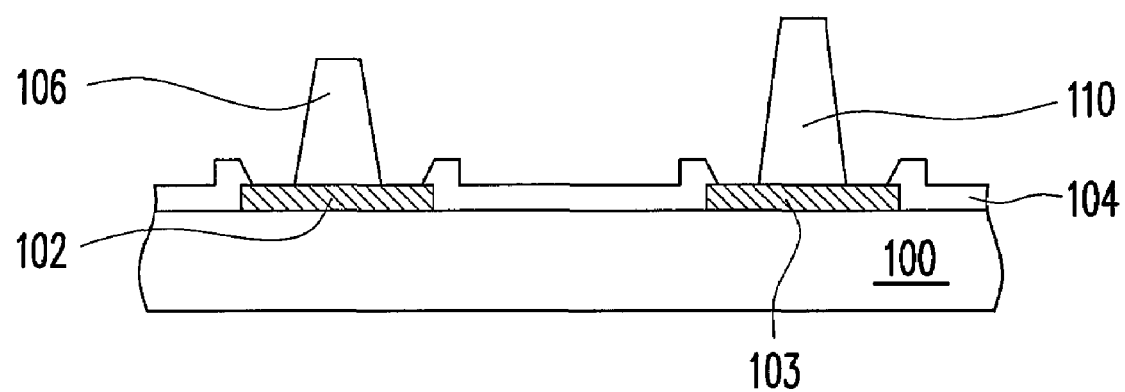

The second bumps in the aforementioned embodiments are disposed in areas of the substrate having no electrodes formed thereon. However, there is no intention of limiting the scope of the present invention as such. In practice, the second bumps can be formed on the electrode as shown in FIG. 7. As shown in FIG. 7, according to another embodiment of the present invention, the substrate also includes another electrode 103 beside the electrode 102. The first bump 106 is disposed on the electrode 102. In particular, the second bump 110 is disposed on the electrode 103. FIG. 7 uses the single second bump configuration of FIGS. 2A to 2C as an example. Similarly, the second bumps 108a, 108b and 108c of the structure shown in FIGS. 1A to 1C having a plurality of second bumps can be disposed on electrodes (not shown) as well.

Second Embodiment

Figure 8A:
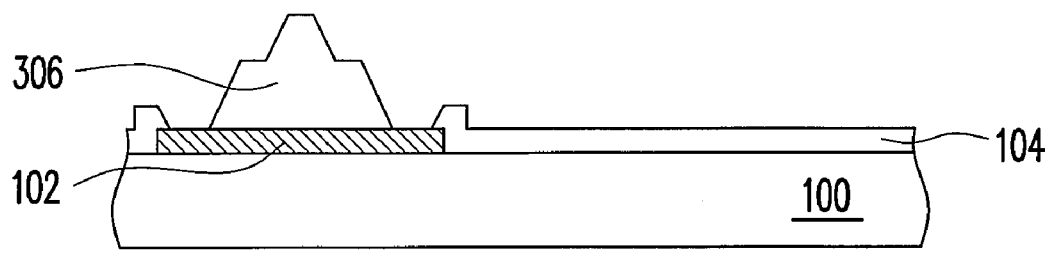
FIGS. 8A to 8C are schematic cross-sectional views showing a bump structure on a substrate and a corresponding bonding process according to another embodiment of the present invention.
Figure 8B:
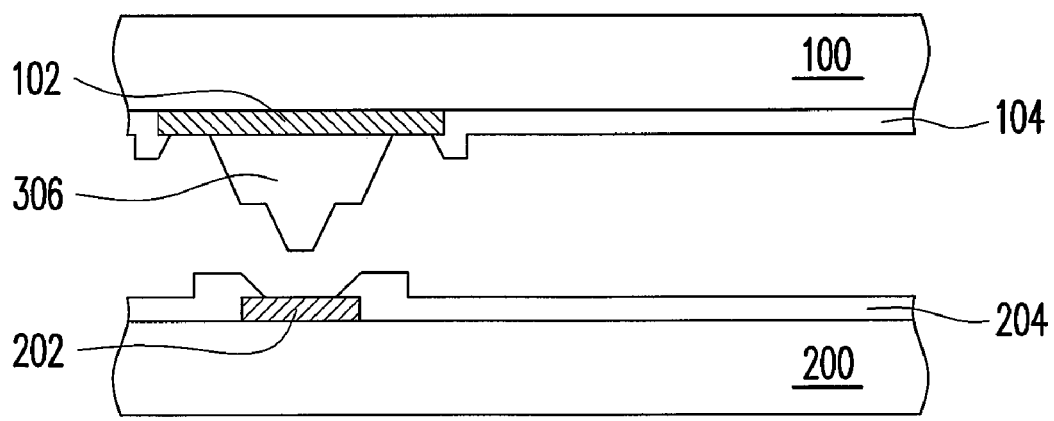
Figure 8C:
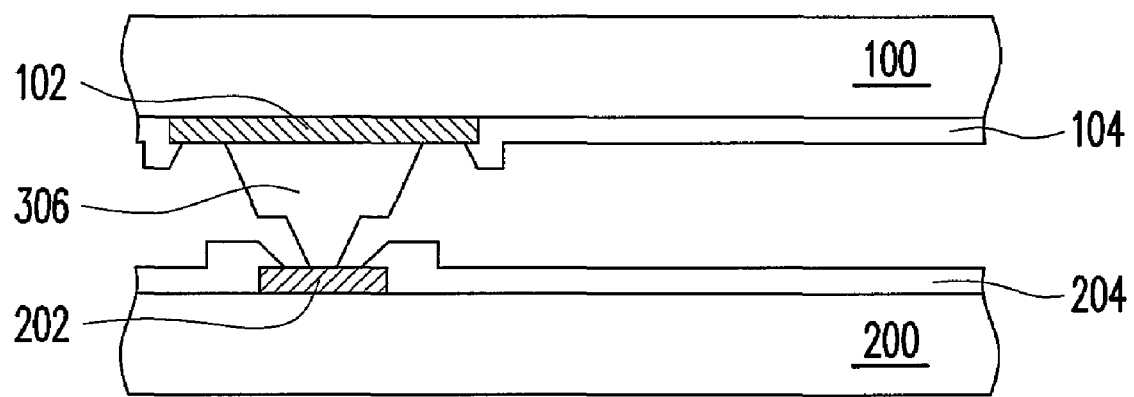

FIGS. 8A to 8C are schematic cross-sectional views showing a bump structure on a substrate and a corresponding bonding process according to another embodiment of the present invention. As shown in FIG. 8, the bump structure of the present embodiment is disposed on a substrate 100 and includes at least one electrode 102 and at least one staircase-shape bump 306. In a preferred embodiment, the electrode 102 is formed on the substrate 100. Furthermore, a passivation layer 104 is also formed on the surface of the substrate 100. The passivation layer 104 exposes the electrode 102. In the present embodiment, the staircase-shape bump 306 is located on the electrode 102. Similarly, the staircase-shape bump 306 can be a metal bump, a conductive bump or an elastic bump comprising a polymer bump and a conductive layer on the polymer bump. In addition, the horizontal cross-section of the staircase-shape bump 306 is a circle, an ellipse, a rectangle or a polygon. The staircase-shape bump 306 is entirely disposed on the electrode 102 or a part of the staircase-shape bump 306 is disposed on the electrode 102. Moreover, the staircase-shape bump 306 has at least two steps. In the present embodiment, a two step staircase-shape bump 306 is used as an example. However, the present invention is not intended to be limited thereto.

As shown in FIG. 8B, the substrate 100 with the staircase-shape bump 306 already formed thereon is disposed to face another substrate 200. Next, as shown in FIG. 8C, a bonding process is performed so that the staircase-shape bump 306 is made to contact the contact 202 on the substrate 200. At this time, because the staircase-bump 306 is a staircase structure, the staircase-shape bump 306 may deform and the staircase structure of the staircase-shape bump 306 may even disappear if the bonding process is over bonding. As a result, by observing the degree of deformation of the staircase structure of the staircase-shape bump 306 after the bonding process, whether the gap between the two substrates 100 and 200 meets the standard can be determined and the quality of the bonding process can be assessed.

The staircase-shape bump in the foregoing embodiment is formed on the electrode. However, the staircase-shape bump of the present invention may be formed in areas outside the electrode, the details of which are described below.

Figure 9A:
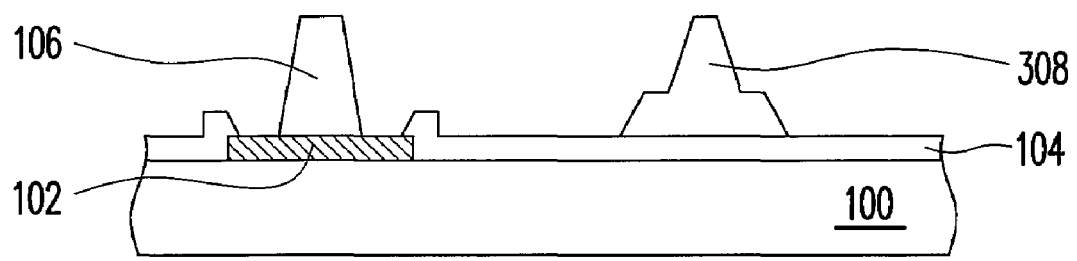
FIGS. 9A to 9C are schematic cross-sectional views showing a bump structure on a substrate and a corresponding bonding process according to yet another embodiment of the present invention.
Figure 9B:
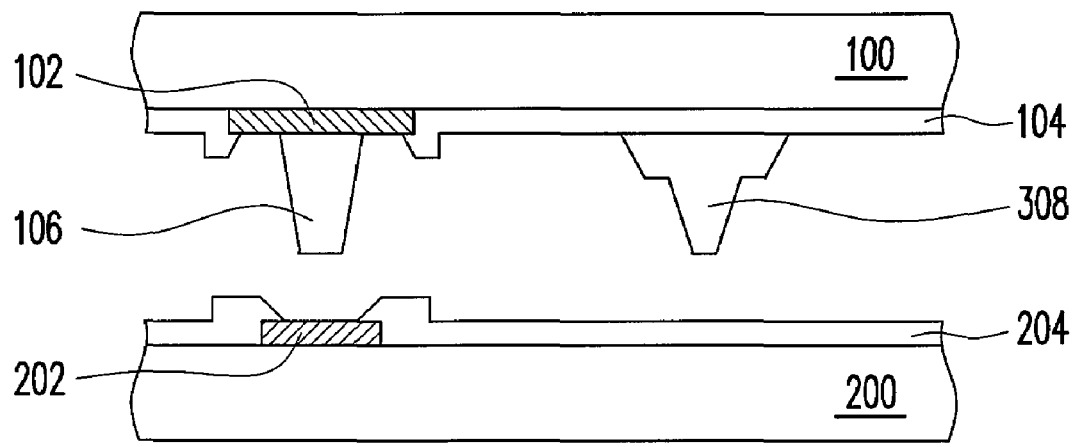
Figure 9C:
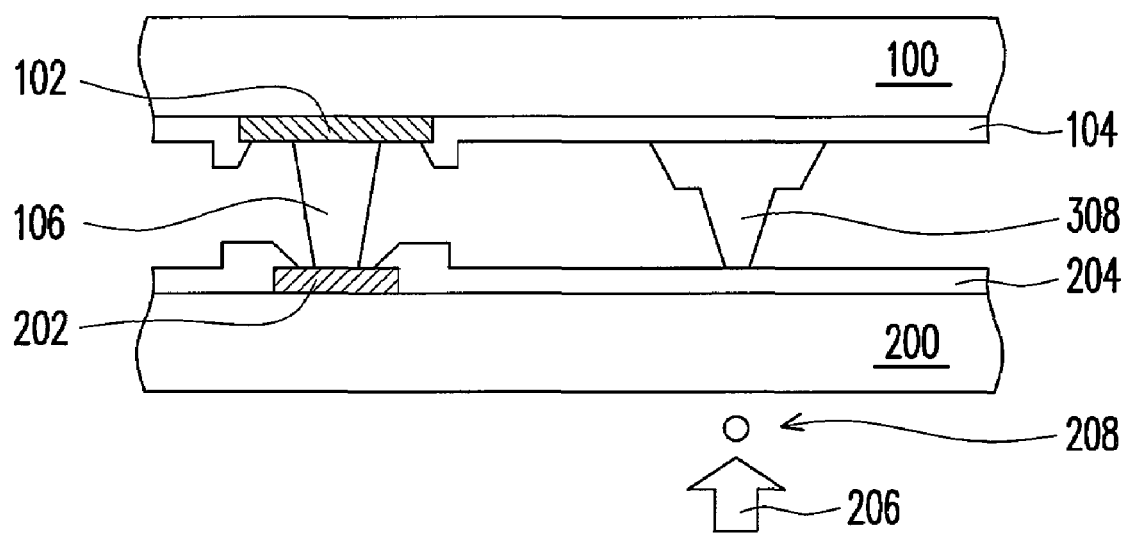

FIGS. 9A to 9C are schematic cross-sectional views showing a bump structure on a substrate and a corresponding bonding process according to yet another embodiment of the present invention. As shown in FIG. 9A, the bump structure in the present embodiment is disposed on a substrate 100. The bump structure includes at least one electrode 102, a bump 106 and at least one staircase-shape bump 308. In the present embodiment, the bump 106 is located on the electrode 102 and the staircase-shape bump 308 is located outside the electrode 102. The height of the staircase-shape bump 308 may be higher than, lower than or identical to the height of the bump 106. In FIG. 9A, the height of the staircase-shape bump 308 identical to the height of the bump 106 is used as an example. Since the material and the shape of horizontal cross-section of the bump 106 and the staircase-shape bump 308 are identical or similar to the foregoing embodiments of the present invention, a detailed description is omitted. In addition, the staircase-shape bump 308 has at least two steps. The figure of the present embodiment uses a two step staircase-shape bump 308 as an example. However, the present invention is not intended to be limited thereto.

As shown in FIG. 9B, the substrate 100 with the bump 106 and the staircase-shape bump 308 already formed thereon is disposed to face another substrate 200. Next, as shown in FIG. 9C, a bonding process is performed so that the bump 106 is made to contact the contact 202 on the substrate 200. At this time, because the height of the staircase-bump 308 is identical to the height of the bump 106, the staircase-shape bump 308 may deform and the staircase structure of the staircase-shape bump 308 may even disappear if the bonding process is over bonding. Conversely, the staircase-shape bump 308 may contact the substrate 200 if the bonding is inadequate. Consequently, by looking from a direction indicated by the labelled arrow 206 and observing the pattern 208 (degree of deformation) produced by the staircase-shape bump 308 after the bonding process, whether the gap between the two substrates 100 and 200 meets the standard can be determined and the quality of the bonding process can be assessed.

Figure 10A:
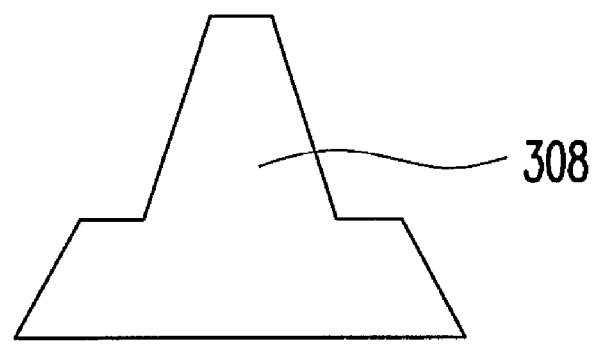
FIG. 10A is a schematic cross-sectional view of a double-sided staircase-shape bump according to an embodiment of the present invention.
Figure 10B:
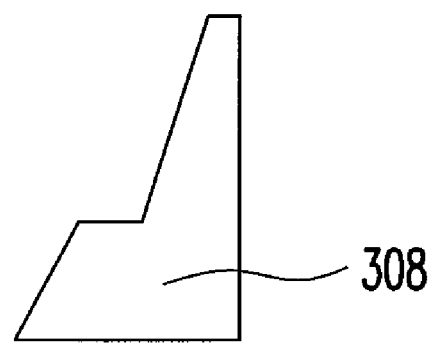
FIG. 10B is a schematic cross-sectional view of a one-sided staircase-shape bump according to an embodiment of the present invention.

In the foregoing embodiment, the shape of the vertical cross-section of the staircase-shape bump 308 is a double-sided staircase (as shown in FIG. 10A). In practice, the present invention also allows the formation of a single-sided staircase-shape bump (as shown in FIG. 10B) on the substrate to determine the quality of a bonding process.

Figure 11:
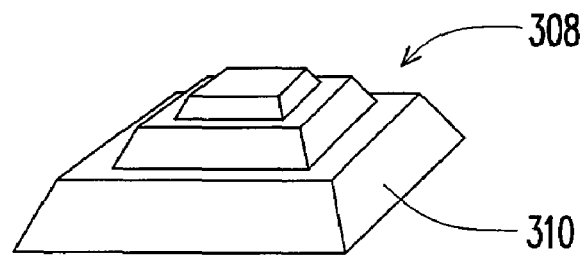
FIG. 11 is a perspective view of a staircase-shape bump according to an embodiment of the present invention.
Figure 12A:
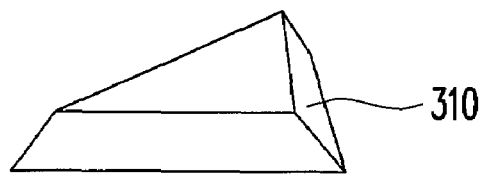
FIGS. 12A to 12C are perspective views of laminations of different configurations.
Figure 12B:
Figure 12C:
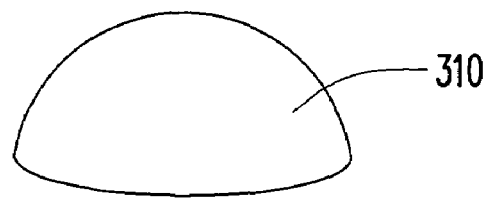

FIG. 11 is a perspective view of a staircase-shape bump according to an embodiment of the present invention. FIGS. 12A to 12C are perspective views of laminations of different configurations. First, as shown in FIG. 11, beside the configurations described in the foregoing embodiments, the configuration of the staircase-shape bump 308 of the present invention can have other variations. More specifically, the staircase-shape bump 308 can comprise a plurality of laminations 310 stacked on the substrate. Each laminations 310 can be a triangular-shape layer (as shown in FIG. 12A), a circular-shape layer (as shown in FIG. 12B), or a hemispherical-shape layer (as shown in FIG. 12C). Moreover, laminations 310 of different shapes can be stacked together according to the actual requirements. In other words, the present invention is not limited to a staircase-shape bump 308 with laminations 310 having an identical shape.

Although the shapes of three types of laminations 310 including a triangular-shape layer (as shown in FIG. 12A), a circular-shape layer (as shown in FIG. 12B) and a hemispherical-shape layer (as shown in FIG. 12C) are listed out in the foregoing embodiment, they are not intended to limit the scope of the present invention. The present invention also allows laminations 310 having different horizontal cross-sections and vertical cross-sections to be selected for constructing the staircase-shape bump 308. In the present embodiment, the horizontal cross-section of the staircase-shape bump 308 can be a circle, an ellipse, a rectangle, a polygon or a combination thereof. Similarly, the vertical cross-section of the staircase-shape bump 308 can be a circle, an ellipse, a rectangle, a polygon or a combination thereof.

Similarly, in the structure of the second embodiment, a non-conductive film (NCF) (not shown) can be formed between the two substrates 100 and 200. In addition, the present invention sets no limit on the number of staircase-shape bumps formed outside the electrode 120. In the foregoing embodiment, a substrate with one staircase-shape bump is used as an example. In practice, a plurality of staircase-shape bumps can be used. Furthermore, if the staircase-shape bumps are formed on the substrate 100, the overall heights of these staircase-shape bumps can be different. Similarly, if the staircase-shape bumps are formed on the substrate 100, a connecting layer (not shown) may be formed between two adjacent staircase-shape bumps to prevent the staircase-shape bumps from slipping. Furthermore, in the structure of the second embodiment, the bump 106 and the staircase-shape bump 308 shown in FIGS. 8A to 8C or FIGS. 9A to 9C can be a polymer bump or a metal layer cover a polymer bump. Moreover, the metal layer may completely cover, partially cover or not cover the staircase-shape bump made of high molecular material. Additionally, the top surface of the bump 306 (or 106 and 308) in the second embodiment may be flat or pointed.

In summary, in the first embodiment of the present invention, at least two kinds of bumps are disposed on the substrate and the heights of at least two kinds of bumps are different. As a result, the quality of a bonding process can be determined by directly looking at the degree of deformation in the bumps after the bonding process.

In another embodiment of the present invention, a staircase-shape bump is disposed on the substrate. Similarly, by directly looking at the degree of deformation of the staircase-shape bump after the bonding process, the quality of the bonding process can be determined.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A bonding structure, comprising:
 a first substrate, comprising:
  at least one first electrode, disposed on the first substrate;
  at least one first bump, disposed on the first electrode; and
  at least one second bump, disposed on the first substrate, wherein a height of the second bump is greater than a height of the first bump; and
 a second substrate opposite to the first substrate,
 wherein the first bump and the second bump contact the second substrate, and the second bump is deformed.

2. The bonding structure according to claim 1, wherein the first and the second bumps respectively comprise a metal bump, a conductive bump, a polymer bump, or an elastic bump comprising a metal layer cover a polymer bump.

3. The bonding structure according to claim 1, wherein the second bump comprises a polymer bump and a metal layer on the polymer bump, and the metal layer completely covers, partially covers or does not cover the polymer bump.

4. The bonding structure according to claim 1, wherein top surfaces of the first and the second bumps are flat or pointed.

5. The bonding structure according to claim 1, wherein a horizontal cross-section of the first and the second bumps is a circle, an ellipse, a rectangle, a polygon or a combination thereof.

6. A bonding structure, comprising:
 a first substrate, comprising:
  at least one first electrode, disposed on the first substrate;
  at least one first bump, disposed on the first electrode; and
  a plurality of second bumps, disposed on the first substrate, wherein the second bumps have more than two different kinds of heights; and
 a second substrate opposite to the first substrate,
 wherein the first bump and the second bumps contact the second substrate, and at least one of the second bumps is deformed.

7. The bonding structure according to claim 6, further comprising a connecting layer for connecting bottom portions of the second bumps together.

8. The bonding structure according to claim 6, wherein the first and the second bumps respectively comprise a metal bump, a conductive bump, a polymer bump, or an elastic bump comprising a metal layer cover a polymer bump.

9. The bonding structure according to claim 6, wherein the second bump comprises a polymer bump and a metal layer on the polymer bump, and the metal layer completely covers, partially covers or does not cover the polymer bump.

10. The bonding structure according to claim 6, wherein top surfaces of the first and the second bumps are flat or pointed.

11. The bonding structure according to claim 6, wherein a horizontal cross-section of the first and the second bumps is a circle, an ellipse, a rectangle, a polygon or a combination thereof.

12. A bonding structure, comprising:
   a first substrate, comprising:
      at least one electrode, disposed on the first substrate;
      at least one bump, disposed on the electrode;
      at least one staircase-shape bump, disposed on the first substrate; and
   a second substrate opposite to the first substrate,
   wherein the bump and the staircase-shape bump contact the second substrate, and the staircase-shape bump is deformed.

13. The bonding structure according to claim 12, wherein the staircase-shape bump is located on the electrode or part of the electrode.

14. The bonding structure according to claim 12, further comprising a bump located on the electrode and the staircase-shape bump is located outside the electrode.

15. The bonding structure according to claim 12, wherein the staircase-shape bump has at least two levels.

16. The bonding structure according to claim 12, wherein the staircase-shape bump comprises a metal bump, a conductive bump, a polymer bump or an elastic bump comprising a metal layer cover a polymer bump.

17. The bonding structure according to claim 12, wherein top surface of the staircase-shape bump is flat or pointed.

18. The bonding structure according to claim 12, wherein the staircase-shape bump comprises a plurality of laminations stacked on the substrate.

19. The bonding structure according to claim 18, wherein a horizontal cross-section of each lamination is a circle, an ellipse, a rectangle, a polygon or a combination thereof.

20. The bonding structure according to claim 18, wherein a vertical cross-section of each lamination is a circle, an ellipse, a rectangle; a polygon or a combination thereof.

21. The bonding structure according to claim 12, wherein the staircase-shape bump is a single-sided staircase-shape bump or a double-sided staircase-shape bump.

* * * * *